United States Patent [19]

Kunz

[11] Patent Number: 5,043,664
[45] Date of Patent: Aug. 27, 1991

[54] MAGNETIC RESONANCE SPECTROSCOPY METHOD AND DEVICE FOR PERFORMING THE METHOD

[75] Inventor: Dietmar W. Kunz, Quickborn, Fed. Rep. of Germany

[73] Assignee: U.S. Philips Corp., New York, N.Y.

[21] Appl. No.: 430,742

[22] Filed: Nov. 1, 1989

[30] Foreign Application Priority Data

Nov. 3, 1988 [DE] Fed. Rep. of Germany ....... 3837317

[51] Int. Cl.⁵ .......................................... G01R 33/20
[52] U.S. Cl. ..................................... 324/307; 324/312
[58] Field of Search .............. 324/300, 307, 309, 308, 324/311, 312, 313, 314, 318, 322; 128/653 A

[56] References Cited

U.S. PATENT DOCUMENTS

| | | | |
|---|---|---|---|
| 4,068,161 | 10/1978 | Ernst | 324/311 |
| 4,345,207 | 8/1982 | Bertrand et al. | 324/308 |
| 4,470,014 | 9/1984 | Levitt et al. | 324/311 |
| 4,510,449 | 4/1985 | Ernst et al. | 324/309 |
| 4,521,732 | 6/1985 | Pegg et al. | 324/300 |
| 4,678,995 | 7/1987 | Avison et al. | 324/309 |
| 4,769,604 | 9/1988 | Sepponen | 324/311 |
| 4,774,467 | 9/1988 | Sorensen | 324/311 |
| 4,789,832 | 12/1988 | Nagayana | 324/312 |
| 4,924,183 | 5/1990 | Kunz et al. | 324/309 |
| 4,959,612 | 9/1990 | Luyten | 324/311 |
| 4,987,369 | 1/1991 | Van Stapele et al. | 324/307 |

Primary Examiner—Michael J. Tokar
Attorney, Agent, or Firm—Jack D. Slobod

[57] ABSTRACT

In order to suppress a doublet structure in a carbon spectrum due to J-coupling between carbon and hydrogen spins in compounds containing at least one CH group, a first magnetic rf field having a frequency equal to the Larmor frequency of carbon is generated, after which a second magnetic rf field having the Larmor frequency of the hydrogen in the relevant CH group is applied to the examination zone, and the spin resonance signal generated is detected. Decoupling is achieved with a reduced rf load in that a magnetic rf pulse having the duration T and the amplitude $B_p$ is generated a predetermined period of time dt after the end of excitation of the carbon, after which the amplitude of the rf field is immediately reduced to a value $B_c$ and the spin resonance signal is detected, the parameters dt, Bc and Bp being chosen so that the modulation of the spin resonance signal caused by the J-coupling is exactly eliminated.

4 Claims, 2 Drawing Sheets

MAGNETIC RESONANCE SPECTROSCOPY METHOD AND DEVICE FOR PERFORMING THE METHOD

BACKGROUND OF THE INVENTION

1. Field of the Invention

The invention relates to a magnetic resonance spectroscopy method in which a first magnetic rf field having the Larmor frequency of carbon is generated in order to suppress the doublet structure of at least one CH group in compounds containing carbon and hydrogen, after which a second magnetic rf field having the Larmor frequency of the hydrogen in the relevant CH groups is applied to the examination zone and the spin resonance signal formed is detected. The invention also relates to a device for performing the method.

2. Description of the Related Art

In the spectroscopic examination of compounds containing carbon and hydrogen the carbon spectra (of the 13 C isotope) exhibit vigorous structures which are due to the J couplings of the carbon atoms to the hydrogen nuclei. Depending on the orientation of the nuclear spins of the hydrogen atoms coupled to the carbon atoms, the magnetic field at the area of the relevant carbon atom will be larger or smaller resulting in different Larmor frequencies of a plurality of closely neighbouring lines (multiplet) in the spectrum.

It is inter alia known from U.S. Pat. No. 4,470,014 that this multiplet structure can be reduced by applying a magnetic rf field having the Larmor frequency of hydrogen during the detection of the spin resonance signal whose frequency corresponds to the Larmor frequency of carbon. This rf field continuously flips the nuclear spins of the hydrogen atoms coupled to the carbon atoms to and fro during the measurement of the spin resonance signals, so that on average in time they no longer influence the carbon atoms. This method is referred to as "decoupling" and the spectra thus formed are referred to as decoupled spectra.

However, it is imperative that the rf magnetic field influences the hydrogen nuclei, i.e. the protons, to a substantially higher degree than the J coupling. When the CH group whose multiplet structure is to be suppressed exhibits a strong J coupling, very strong rf magnetic fields are required so that the associated rf load precludes the use of such methods for in vivo examinations.

SUMMARY OF THE INVENTION

It is the object of the present invention to suppress doublet structures (caused by CH groups where each time only one hydrogen atom is bound to one carbon atom) with a reduced rf power.

To achieve this, in accordance with the invention a magnetic rf pulse having the duration T and the amplitude $B_p$ is generated a predetermined period of time dt after the end of the excitation of the carbon, the amplitude of the rf field being reduced to a value $B_c$ immediately thereafter and the spin resonance signal being detected, the parameters T, dt, Bc and Bp being chosen so that the modulation of the spin resonance signal, caused by the J coupling is exactly eliminated.

Thus, in accordance with the invention the rf magnetic field having the Larmor frequency of hydrogen acts on the examination zone in two phases: during the first phase with a high amplitude and during the second phase with a low amplitude. The duration of the first phase is short in comparison with that of the second phase (it corresponds to one rf pulse) and the spin resonance signal is measured only during the second phase. It can be demonstrated that the duration of the rf pulse T, the amplitudes $B_p$ and $B_c$ of the rf magnetic field during these phases and the distance in time between the rf pulse and the preceding excitation of the carbon atoms can always be adjusted so that the modulation of the spin resonance signal, caused by the J coupling, and hence the doublet structure, is exactly eliminated so that only one line is received at that area.

However, this line does not have the double amplitude like the doublet lines, but an amplitude which is lower as the rf field is smaller in comparison with the J coupling during the second phase. For very low magnetic field strength $B_c$, the amplitude is proportional to $B_c$. This dependency is used by a further version of the invention where the value $B_c$ is zero for the suppression of the relevant CH group in the spectrum. Thus, a given CH group can be completely eliminated from the spectrum measured.

The invention can be used inter alia for identifying given CH groups whose Larmor frequencies are known by comparing the spectrum decoupled in accordance with the invention with a non-decoupled spectrum, in which case differences occur only for the CH groups whose hydrogen Larmor frequencies are applied.

BRIEF DESCRIPTION OF THE DRAWING

The invention will be described in detail hereinafter with reference to the drawing. Therein FIG. 1 diagrammatically shows an apparatus for carrying out the invention.

DETAILED DESCRIPTION OF THE PREFERRED EMBODIMENT

Figure 1:
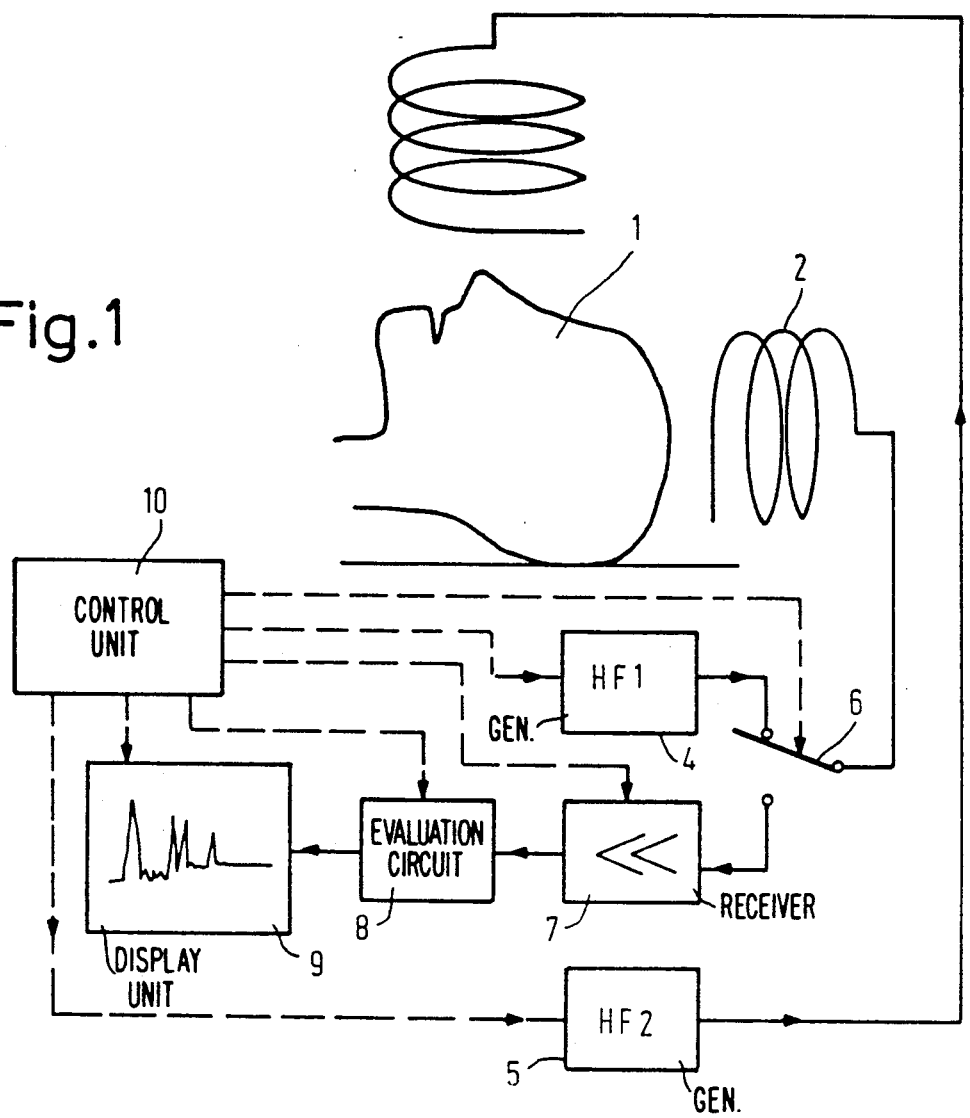

The reference numeral 1 in FIG. 1 denotes a patient who is situated in an examination zone and who is exposed to a strong, uniform and steady magnetic field. This magnetic field extends perpendicularly to the plane of drawing and is generated by a magnet (not shown). For spectroscopy purposes its induction amounts to for example, 4 Tesla. For 4 Tesla, the Larmor frequency of 13 C nucleii amounts to approximately 42.8 MHz, and the Larmor frequency of protons amounts to approximately 170 MHz.

The apparatus comprises a first rf generator 4 which generates oscillations having the Larmor frequency of the carbon and which is connected, via a switch 6, to a first rf coil 2 which is tuned to this frequency and which acts on the examination zone. A second rf generator 5 generates oscillations of the Larmor frequency of the (hydrogen) protons and is connected to an rf coil 3 which also generates a magnetic field which extends perpendicularly to the steady magnetic field in the examination zone.

The spin resonance signals arising in the examination zone at the Larmor frequency of carbon are detected by the coil 2 and are applied to a receiver 7 via the switch 6. To the output of the receiver 7 there is connected an evaluation circuit 8 which forms the spectrum from the spin resonance signal received, using Fourier transformation, which spectrum can be displayed on a suitable display unit 9. The components 4 . . . 9 are controlled by a control unit 10 which may comprise a suitable microcomputer or the like.

Figure 2:
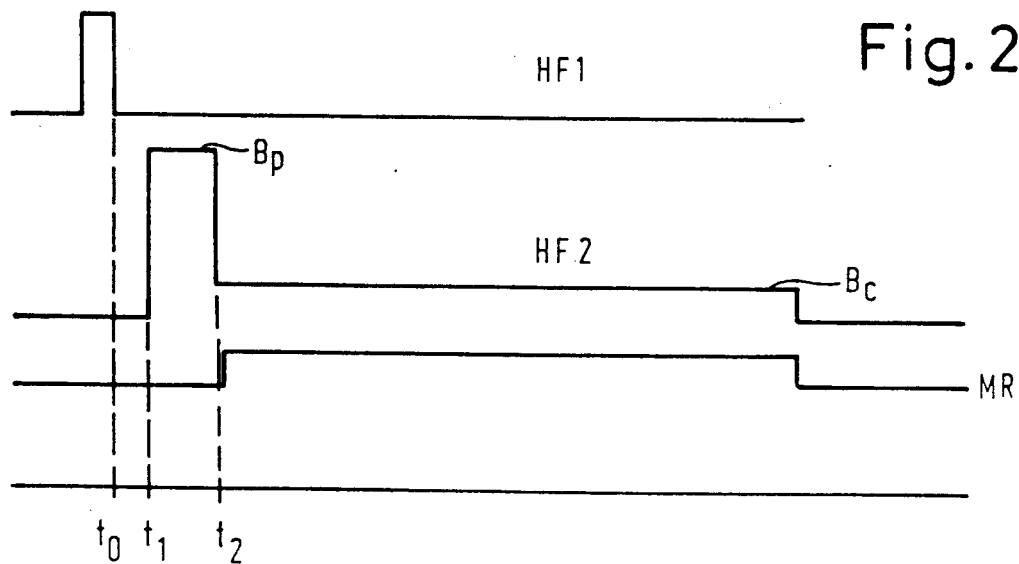
FIG. 2 shows the variation in time of the signals in a method in accordance with the invention, FIGS. 3a and b show non-decoupled and decoupled spectra, respectively.

FIG. 2 indicates when the two rf generators and the receiver are active. First, the rf generator 4 generates a short rf excitation pulse at the Larmor frequency of carbon, preferably a 90° rf pulse, which terminates at the instant $t_0$ (first line of FIG. 2). At the instant $t_2$ briefly thereafter, the spin resonance signal which is generated by this rf pulse and whose frequency is approximately equal to the Larmor frequency of carbon is received and sampled (third line of FIG. 2), that is to say during a period of time which is very long in comparison with the duration of the rf pulse, generating this spin resonance signal, for example 200 ms. If the rf generator 5 were not activated during this period of time or the preceding period, the (non-decoupled) carbon spectrum shown in FIG. 3a would be produced. At approximately 130 ppm a double line (doublet) is clearly shown, which doublet originates from a non-saturated fatty acid from the section —CH=CH—. The Larmor frequency of the protons contained therein deviates from the Larmor frequencies of the protons bound in other CH groups so that it is characteristic of this section.

In order to suppress the doublet structure of this section (so as to produce the decoupled spectrum shown in FIG. 3b), after the instant $t_0$ the second rf generator 5 is activated, that is to say with a frequency which corresponds to the previously described characteristic Larmor frequency of the protons in the relevant section. The amplitude of the magnetic rf field is then raised to a comparatively high value $B_p$ at the instant $t_1$, and at the instant $t_2$ it is lowered to a comparatively small value $B_c$. In comparison with the period of time during which the spin resonance signal is detected, the period of time $t_1 - t_2$ is substantially shorter than shown in FIG. 2. The application of the proton Larmor frequency with the amplitude $B_c$ ceases when the detection of the spin resonance signal ceases.

Figure 3:
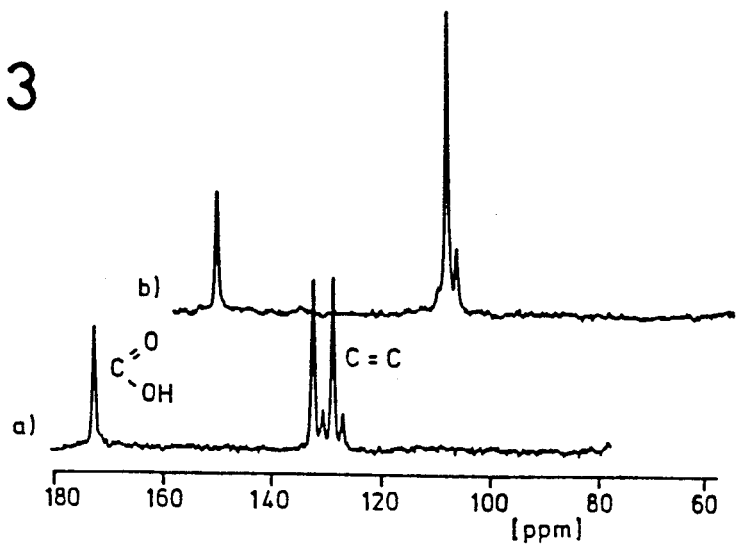
Figure 4:
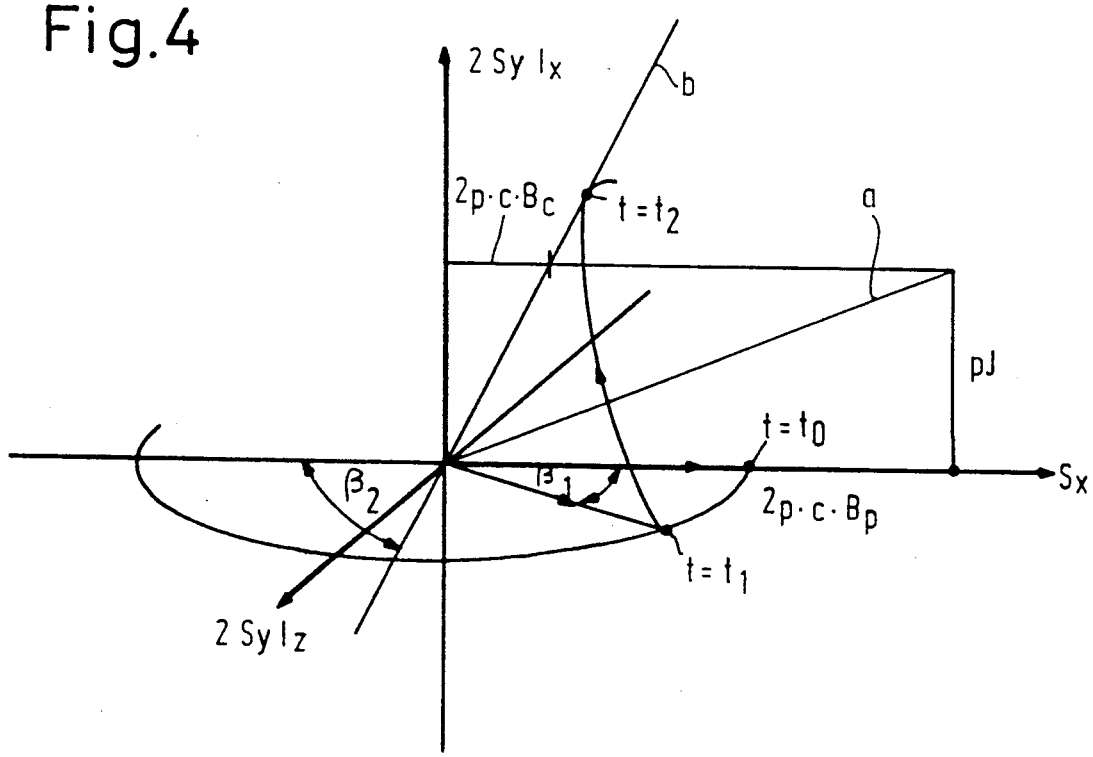
FIG. 4 shows a product operator representation illustrating the principle of the invention.

It can be demonstrated that when $B_p$, $B_c$, $T = t_1 - t_2$ and $dt = t_1 - t_0$ are suitably chosen, the modulation of the spin resonance signal, caused by J-coupling, is eliminated so that the spectrum exhibits only a single line at the relevant location (see FIG. 3b). This will be explained hereinafter with reference to FIG. 4 which shows the effects of the various measures in a product operator representation (see Progress in NMR spectroscopy, Vol. 16, pp. 163-192, 1983). The spin of the 13 C nucleus is denoted by S and that of the $^1$H nucleus by I.

At the instant $t = t_1$ the nuclear magnetisation extends in the direction $S_x$ when the pulse having the carbon Larmor frequency rotates the nuclear magnetisation vector 90° about the y-axis. Under the influence of the J-coupling, a rotation towards the state $2S_yI_z$ occurs, the state $2S_yI_y$ remaining the same. The angle $\beta_1$ completed at the instant $t = t_1$ satisfies the equation $$\beta_1 = pJ(t_1 - t_0) \quad (1)$$

Therein, p is the constant pi (3.14159 . . .) and J is the value of the J-coupling At the instant $t_1$ the rf field $B_p$ is activated with the proton Larmor frequency. When considered separately, this field rotates the product operator between the states $2S_yI_z$ and $2S_yI_x$ if the proton spins are rotated about a y-reference axis, and does not influence the state $S_x$. Under the combined effect of this rf field and the J-coupling, the product operator is rotated on the envelope of a cone whose apex is situated in the coordinate origin and whose symmetry axis a is determined by the strength of the field $B_p$ and the J-coupling. At the instant $t = t_2$ the product operator is situated exactly on a straight line b through the coordinate origin which encloses the angle $\beta_2$ with respect to $S_x$ and which is situated in the plane defined by $2S_yI_x$ and $S_x$.

At the instant $t = t_2$ the amplitude $B_p$ is reduced to a value $B_c$ which relates to the J-coupling in the same way as the component $S_x$ relates to the component $2S_yI_x$. Thus, $$\beta_2 = \arctan (J/2cB_c) \quad (2)$$

Therein, c is the gyromagnetic ratio (approximately 42.58 MHz/T for protons) and arctan ( ) is the inverse function of the tangent function, i.e. tan (arctan ( )) = ( ). In this case the nuclear magnetisation remains fixed under the influence of the field $B_c$ and the J-coupling, i.e. the signal observed no longer exhibits modulation by the J-coupling. In the decoupled spectrum, therefore, a single line appears instead of the double line.

When the distance in time $dt = t_1 - t_0$ is predetermined and $B_c$ is chosen in accordance with the equation (2), the amplitude of the magnetic rf field $B_p$ in the interval $T_2 - T_1$ will be $$B_p = J/2c * \sin\beta_2/(\cos\beta_1 - \cos\beta_2) \quad (3)$$

The angle $\beta_3$ *described by the product vector characterising the nuclear magnetisation in the interval* $t_2 - t_1$ is then given by:

$$\beta_3 = 2 \arctan ((\cos\beta_1 - \cos\beta_2)^{0.5}/\sin\beta_1) \quad (4)$$

For the duration T or the time interval $t_2 - t_1$ it follows therefrom that $$T = t_2 - t_1 = \beta_3/((2pcB_p)^2 - (pJ)^2)^{0.5} \quad (5)$$

Thus, when the parameters $B_c$, $B_p$, dt and T are chosen so that the equations 1 and 5 are satisfied for a given CH group, the double line occurring in the non-decoupled spectrum becomes a single line for this group. However, the amplitude of this line does not correspond to the sum of the amplitudes of the double lines, but is a factor $\cos\beta_2$ lower than this value. Therefore, the corresponding frequency component must be multiplied by the value $\beta_2$ in the evaluation unit 8.

The value $B_c$ must be chosen so that the permissible rf load is not exceeded; however, it can also be chosen so as to equal zero. In that case $\beta_2$ is 90°, so that the amplitute of the line appearing instead of the double line becomes zero because $\cos\beta_2 = 0$. In this case the equation (3) is simplified:

$$B_p = J/(2c* \cos\beta_1) \quad (6)$$

This means that the spin resonance signal originating from a given CH group (at the Larmor frequency of carbon) can be fully suppressed when, after the carbon excitation pulse and before the detection of the spin resonance signal, an rf pulse of the Larmor frequency of the protons present in the CH group is applied to the examination zone for a period of time T determined by the equation (5). Lines can thus be deliberately removed from the spectrum. The method in accordance with the invention only influences the spectral lines of CH groups whose proton Larmor frequency is identical to the frequency generated by the second rf generator 5 and whose J-coupling has the value J in conformance to the equations (2) and (3). Generally, only one CH group satisfies these conditions; this fact can be used for identifying this CH group when the position of the double line of this group in the carbon spectrum, the exact value of the proton Larmor frequency, and the J coupling are known. The rf generator 5 is then adjusted to the corresponding proton Larmor frequency, the other parameters following from the equations 1 to 5. If a change occurs in the decoupled carbon spectrum in the position in which the double line of the CH group occurred in the non-decoupled spectrum, the relevant CH group has thus been identified.

I claim:

1. A magnetic resonance spectroscopy method for, in the presence of a steady magnetic field applied to an examination zone the strength of this field determines Larmor frequencies of carbon and hydrogen, obtaining a spin resonance signal for producing a carbon spectrum in which a doublet structure from a compound containing at least one relevant CH group due to modulation of the spin resonance signal caused by J-coupling between the hydrogen and carbon of said group is suppressed, said method comprising:

first generating in said examination zone a first magnetic rf field excitation pulse having a frequency equal to the Larmor frequency of carbon;

second generating in said examination zone, a predetermined period dt after the end of said excitation pulse, a second magnetic rf field having a frequency equal to the Larmor frequency of the hydrogen of said CH group, said second magnetic rf field having an amplitude waveform comprising an initial phase having a duration T and an amplitude $B_p$, at the end of which initial phase the amplitude is reduced from $B_p$ to $B_c$; and, detecting during a duration of said amplitude $B_c$, a spin resonance signal produced in said examination zone;

wherein T, dt, $B_c$ and $B_p$ are chosen so that the modulation of the spin resonance signal caused by J-coupling between the hydrogen and carbon in said relevant group is eliminated.

2. A method as claimed in claim 1, wherein said amplitude $B_c$ is zero.

3. A magnetic resonance spectroscopy device for, in the presence of a steady magnetic field applied to an examination zone the strength of which field determines Larmor frequencies of carbon and hydrogen, obtaining a spin resonance signal for producing a carbon spectrum in which a doublet structure from a compound containing at least one relevant CH group due to modulation of the spin resonance signal caused by J-coupling between the hydrogen and carbon of said group is suppressed, said device comprising:

a control unit;

first means responsive to said control unit for generating in said examination zone a first magnetic rf field excitation pulse having a frequency equal to the Larmor frequency of carbon;

second means responsive to said control unit for generating in said examination zone, a predetermined period dt after the end of said excitation pulse, a second magnetic rf field having a frequency equal to the Larmor frequency of the hydrogen of said CH group, said second magnetic rf field having an amplitude waveform comprising an initial phase having a duration T and an amplitude $B_p$, at the end of which initial phase the amplitude is reduced from $B_p$ to $B_c$; and, third means responsive to said control unit for detecting during a duration of said amplitude $B_c$, a spin resonance signal produced in said examination zone;

wherein T, dt, $B_c$ and $B_p$ are chosen so that the modulation of the spin resonance signal caused by J-coupling between the hydrogen and carbon in said relevant group is eliminated.

4. A device as claimed in claim 3, wherein said amplitude $B_c$ is zero.

* * * * *